United States Patent [19]

Anthony et al.

[11] Patent Number: 4,471,369
[45] Date of Patent: Sep. 11, 1984

[54] ROBOTIC PRESSURE IMAGERS

[75] Inventors: Thomas R. Anthony, Schenectady; Daeyong Lee, Scotia, both of N.Y.

[73] Assignee: General Electric Company, Schenectady, N.Y.

[21] Appl. No.: 293,760

[22] Filed: Aug. 17, 1981

[51] Int. Cl.³ .............. H01L 29/84; H01L 27/02; H01L 29/34
[52] U.S. Cl. .................... 357/26; 357/51; 357/55
[58] Field of Search ............ 357/26, 55, 51; 338/13, 338/22 SD

[56] References Cited

FOREIGN PATENT DOCUMENTS 52-61483  5/1977  Japan ........................... 357/55
52-75993  6/1977  Japan ........................... 357/26

Primary Examiner—Andrew J. James
Assistant Examiner—J. Carroll
Attorney, Agent, or Firm—Leo I. MaLossi; James C. Davis, Jr.; James Magee, Jr.

[57] ABSTRACT

A fine-scale array of pressure transducers which mimic biological nerve endings and are particularly useful in robotic architecture are provided.

8 Claims, 5 Drawing Figures

ROBOTIC PRESSURE IMAGERS

CROSS-REFERENCE

The inventions disclosed and claimed in co-assigned U.S. patent applications Ser. No. 267,235, filed May 26, 1981, and Ser. No. 282,218, filed July 10, 1981, which may be material to the examination of this application, are incorporated herein by reference.

BACKGROUND OF THE INVENTION

Robots and the science of robotics are receiving increasing interest and attention both in terms of use in industrial environments and research to improve existing robots and develop far more sophisticated robots.

Robots of the current generation may be equipped with elementary artificial vision and tactile sensors, e.g., television cameras and pressure sensitive switches or load cells, respectively. The ability to accurately sense small variations in pressure, ideally on the scale exhibited by biological fingers, and utilize that information in an interactive or feedback system, is predicted to become an increasingly important area of robotic technology in the future.

SUMMARY OF THE INVENTION

The pressure imager of the invention consists of a plurality of sensing cells or regions arranged in an array or pattern in a body of semiconductor material, a layer of the oxide of the semiconductor material situated on and contiguous with a substantial portion of the top major surface of the body, and an adherent layer of piezo-electric material over the oxide layer. Preferably, the piezo-electric material is a flexible, compliant, and tough polymer such as polyvinylidene fluoride. The small size of the individual sensing regions yields a highly sensitive imager ideally suited for use in robotic architecture.

The individual sensing cells are of the piezo-electric gate controlled diode (PZGCD) type or the piezo-electric field effect transistor (PZFET) type selected primarily with reference to the operating environment. The PZGCDs are characterized by a small diameter substantially cylindrical hole which extends completely or substantially through the thickness of the body between the major top and bottom surfaces of the body and a substantially cylindrical semiconductor region of generally uniform cross-section which is substantially concentric with the hole and extends between the major surfaces. The conductivity type of the semiconductor region is made opposite to that of the body of semiconductor material, thus a substantially cylindrical P-N type junction extending between the major top and bottom surfaces of the body is formed with the body. The individual cells are separated by a gridwork of excavations in the top surface of the body or, preferably, by a gridwork of heavily doped regions extending a short distance into the interior of the body from the top major surface.

Cells having piezo-electric field effect transistors (PZFETs) are similar to cells having PZGCDs, except there are two spaced holes with their associated substantially concentric cylindrical semiconductor regions per cell.

DETAILED DESCRIPTION OF THE INVENTION

Figure 1:
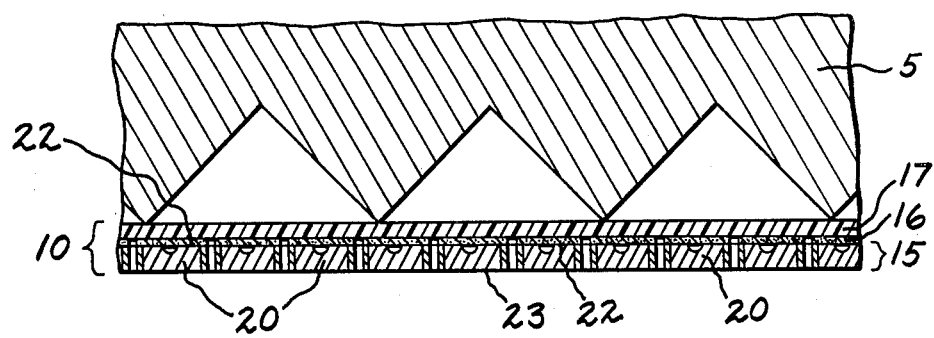
FIG. 1 is an elevation view, schematic in form and in cross-section, of a portion of a robotic pressure imager of this invention with an object situated thereon.

With reference to FIG. 1, there is shown in schematic cross-section a portion of a robotic pressure imager 10 of the present invention. Illustratively, an object, i.e., bolt 5 whose size, shape, and weight are to be sensed, is shown situated on imager 10.

The principal elements of imager 10 are a plurality of sensing regions 20 situated in a pattern or array in a body 15 of semiconductor material, a layer 16 of the oxide of the semiconductor material covering at least a substantial portion of top surface 22 of body 15, and a layer 17 of piezo-electric material situated over and adherent to oxide layer 16. Sensing regions 20 are considerably smaller than the features of the object to be sensed, thus the imager of this invention has high sensitivity.

The semiconductor material of body 15 may be selected from those materials which are known by the practitioners of the art of the construction of semiconductor or microelectronic devices. Suitable materials include silicon, germanium, compounds of a group III element of the periodic table and a group V element (e.g., gallium arsenide) and compounds of a group II and a group VI element (e.g., cadmium telluride). Silicon is presently preferred due to its availability and the ease with which a passivating film, e.g., layer 16, may be formed. Body 15, and imager 10, are in the form of thin, i.e., on the order of about 6 to about 100 mils in thickness, wafers or chips whose shape is determined in accordance with the dictates of the particular robotic architecture with which imager 10 is to be used. The thickness dimension, measured as the perpendicular distance between top major surface 22 and bottom major surface 23, is, therefore, small in comparison to the lateral dimensions of top 22 and bottom 23 major surfaces of body 15.

Conventional piezo-electric materials, e.g., quartz, Rochelle salt, and lithium sulphate monohydrate ($Li_2SO_4 \cdot H_2O$), can be used for layer 17. However, since the aforementioned conventional materials are typically hard, stiff and brittle, a preferred alternate is a thermoplastic fluorocarbon polymer such as polyvinylidene fluoride ($PVF_2$). These polymers are compliant, flexible, and tough and are available commercially as sheets as thin as 6 $\mu$m in rolls 1000 meters long and over 1 meter wide. Moreover, in such quantities, they are relatively inexpensive compared to the conventional piezo-electric materials. In addition, $PVF_2$, like Teflon ®, is chemically inert, electrically insulating, and has been used as a protective coating for metallic surfaces. These polymers can be easily applied as adherent layer 17 by the use of suitable adhesives, such as rubber cement or epoxy, or by heating to about 200° C., with pressure applied, for a time sufficient to render the polymer tacky and then cooling.

Figure 2:
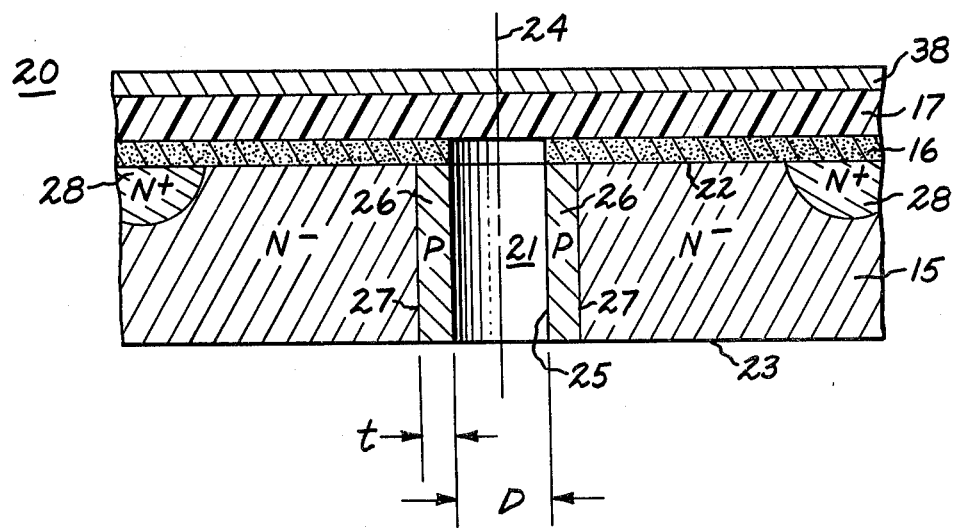
FIG. 2 is an elevation view, schematic in form and in cross-section, of one of the sensing cells of the imager of FIG. 1 of the piezo-electric gate controlled diode type.

In FIG. 2, there is shown schematically in more detail a single sensing region or cell 20. Region 20 of FIG. 2 is a piezo-electric gate controlled diode (PZGCD) made in accordance with the method disclosed and claimed in the above-referenced Ser. No. 267,235 application. For purposes of illustration, the material of body 15 is silicon with a substantially uniform distribution of atoms of an impurity element, i.e., a dopant, therein. The concentration of the dopant atoms is typically measured in terms of the resistivity of body 15 and, if selected properly, will impart P-type or N-type conductivity to the silicon. As is known by the practitioners of the semiconductor arts, if the dopant atoms are Al, Ga or B, for example, the silicon will exhibit P-type conductivity and if the dopant atoms are As, Sb, or P, for example, the silicon will exhibit N-type conductivity. Illustratively, the silicon of body 15 of FIG. 2 is lightly doped, i.e., has a low concentration of impurity atoms and is of the N− type as indicated by the symbol N−. Body 15 is lightly doped so that its conductivity type may easily be inverted to the opposite type conductivity by the application of an electrostatic field as discussed further below.

Hole 21 is a cylindrical cavity extending substantially perpendicularly between major top 22 and bottom 23 surfaces of body 15 through the thickness dimension of body 15. Hole axis 24 is substantially parallel to substantially cylindrical inner surface 25 of hole 21.

Holes 21 are best produced by the laser drilling process disclosed in the cross-referenced Ser. No. 267,235 application. Briefly described, a laser such as ESI, Inc. Model 25 Laser Scribing System modified with a 10 watt (maximum) optoacoustic Q-switched Nd:YAG head manufactured by U.S. Laser Corp. is used. The laser is operated in a repetitively Q-switched mode with a focused beam size of about 20 microns, a depth of focus of about 250 microns, an individual pulse duration of about 200 nanoseconds and a repetition rate of about 3 KHz. At a power level of about 2 watts, measured independently in a continuously pulsed mode, ten pulse trains of 5 msec duration separated by a 10 msec delay drill approximately 5 holes per second. Using the above parameters, holes 21 as small as about ¾ mil in diameter (D) with axis 24-to-axis 24 spacings as close as about 1.5D can be drilled through 12-mil thick silicon wafers by the laser beam means without spalling, cracking, or introducing stresses or strains, i.e., damage, into the material of semiconductor body 15 adjacent to holes 21.

Region 26 shown in FIG. 2 is a semiconductor region of generally uniform cross-section substantially concentric with hole 21 and extending between surfaces 22 and 23. Region 26 is made by diffusing impurity atoms radially a distance t into body 15 from surface 25 by gas diffusion or from an adherent solid state source in accordance with the method described in more detail in the cross-referenced Ser. No. 267,235 application. In the PZGCDs of this application, region 26 will have at least a different type conductivity from that of body 15.

Interface 27 formed between region 26 and the semiconductor material of body 15, is substantially concentric with hole 21, extends between surfaces 22 and 23, and is situated away from inner surface 25 by the distance, t, to which the impurity atoms diffuse into body 15 from surface 25. Since, as illustratively shown on FIG. 2, the material of body 15 is of N-type conductivity and region 26 is of P-type conductivity, interface 27 will be a P-N type junction.

Longitudinally-extending regions 28 serve to isolate adjacent sensing regions 20. Regions 28 may be excavations below surface 22, but, preferably, regions 28 are semiconductors having the same conductivity type as body 15, but are more heavily doped as indicated by the symbol N+. Doped isolation regions 28 may be formed by diffusing the dopant into body 15 or by ion implantation techniques conventionaly known to those skilled in the art of semiconductor device manufacture. Isolation regions 28 should extend at least about 2 microns into body 15 from surface 22. As noted above, the diameter, D, of hole 21 is typically 1 mil. The center line 24-to-center line 24 distance between adjacent cells 20 should be about 2D, thus regions 28 will be about 1 mil from center line 24. This spacing represents a good trade-off between cell resolution which is a measure of the size of the object which can be sensed and cell sensitivity which is a measure of the cell's ability to detect small changes in pressure per cell surface contact area.

After regions 28 are formed, layer 16 of the oxide of the material of body 15 is formed in contact with surface 22. Since the area of holes 21, as viewed looking down on surface 22, is small in comparison to the surface area of cell 20, as delineated by regions 28, substantialy all of the surface of cell 20 will be covered by oxide layer 16. Thereafter, layer 17 of the piezo-electric material, preferably PVF$_2$, is affixed on top of layer 16 as discussed above. Layer 38, which is optional, is discussed in detail in a subsequent section below.

Figure 2A:
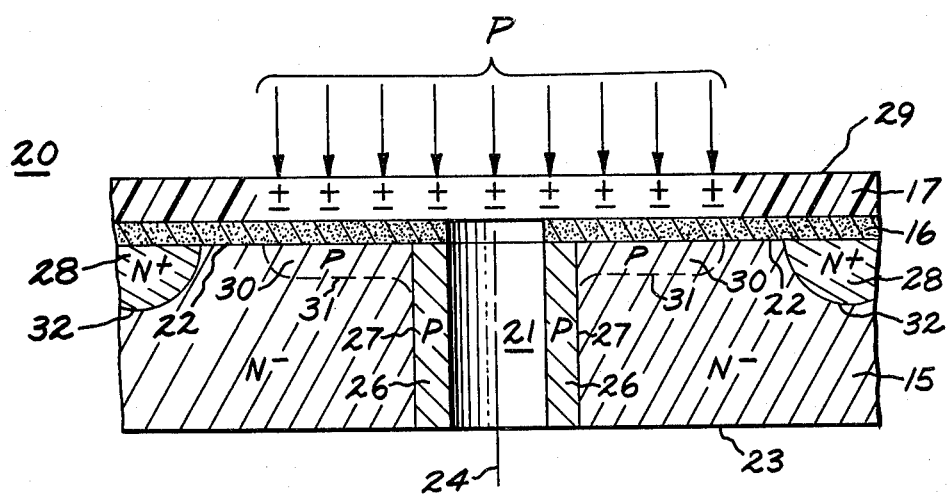
FIG. 2A is an elevation view, schematic in form and in cross-section, of the cell of FIG. 2 drawn to illustrate the principles of operation.

The operation of sensing region 20 is shown schematically in FIG. 2A whereon certain details of FIG. 2 have been omitted for clarity and others added to aid the following description. Any pressure, P, on PVF$_2$ film 17 generates a polarization, P$_Q$, in film 17 that induces a charge, Q$_s$, on surface 29 of the film in accordance with equations (1) and (2)

$$P_Q = \alpha P \tag{1}$$

and $$Q_s = B P_Q \tag{2}$$

where $\alpha$ and $\beta$ are material constants. As with any piezo-electric material, the application of stress generates an electrostatic charge within the material. The polarity of the charge, positive or negative, will be a function of the type of stress, e.g., tensile or compressive, and will either be unique to the material or, as with PVF$_2$, may be imparted by manufacture.

Surface charge Q$_s$ of the proper polarity first causes a space-charge or depletion zone to form in near-surface region 30 and, with increasing pressure, the conductivity type of region 30 changes to the type opposite to that of the material of body 15, as shown in FIG. 2A. With further increases in pressure, region 30 is extended farther away from surface 22. While the pressure-induced changes in region 30 are small, they are much larger and more readily measured than the electrostatic charges in layer 17. Thus, the changes in region 30, including the formation of a depletion zone, may be accurately measured by means of suitable instrumentation, e.g., a capacitance bridge, connected between regions 26 and body 15.

Figure 3:
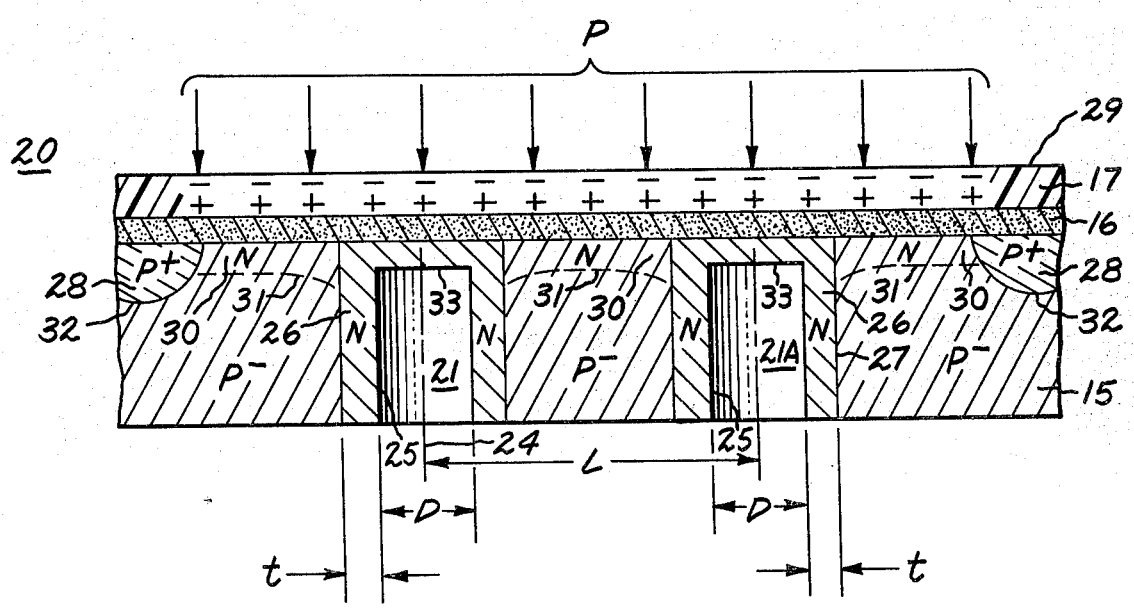
FIG. 3 is an elevation view, schematic in form and in cross-section, of one of the sensing cells of the imager of FIG. 1 of the piezo-electric field effect transistor type.

In FIG. 3, there is shown schematically a single sensing region or cell 20 of the piezo-electric field effect transistor (PZFET) type. The nomenclature of FIG. 2 is carried over to FIG. 3 and is the same except as indicated in the following discussion.

Blind holes or cylindrical cavities 21 and 21A extending from bottom surface 23 into and terminating in the thickness dimension of semiconductor body 15 can reproducibly be made by carefully controlling the number of pulses from the above-described laser operated with the parameters described above. Blind holes are an alternative embodiment of the through-thickness holes shown in FIGS. 2 and 2A, thus the PZGCDs of FIGS. 2 and 2A and the PZFET of FIG. 3 may be made either with through-thickness holes or blind holes. With blind holes 21 and 21A, the dopant is diffused from inner walls 25 as well as from bottoms 33 of the holes to form semiconductor regions 26. Regions 26 will be substantially in the form of right circular cylinders if the cavities are laser drilled substantially completely through body 15, i.e., to within about 10% of the thickness dimension of body 15. In FIG. 3, for illustrative purposes, the conductivity type of body 15 and semiconductor regions 26 have been selected opposite to those shown in FIGS. 2 and 2A, and therefore, the polarity of layer 17 is also selected opposite to that of FIGS. 2 and 2A. As in the case of the PZGCD, the diameter of cavities 21 and 21A is about 1 mil. The center line 24-to-center line 24 distance, L, between holes 21 and 21A of one cell 20 is about 2D, or 2 mils, and the distance between the nearest cavities of adjacent cells 20 is also about 2D, thus regions 28 are approximately equidistant between center lines 24 of adjacent cells.

Pressure, P, is shown applied across the entire sensing surface 29 of cell 20, thus regions 30 extend out to regions 28 and a continous region 30 is formed between semiconductor regions 26 between holes 21 and 21A. Pressure, P, as sensed by PZFET cell 20 of FIG. 3 is best detected and measured in terms of resistance changes measured between semiconductor regions 26 surrounding holes 21 and 21A. Incremental increases in pressure, P, from that depicted in FIG. 3 drives regions 30 deeper into body 15 and produces a further incremental detectable change in resistance. For lighter pressures or pressures over a smaller area of surface 29 than is illustrated in FIG. 3, regions 30 will be less extensive and may not form a continuous region between semiconductor regions 26, however, a detectable change from the unstressed material will be produced.

Figure 4:
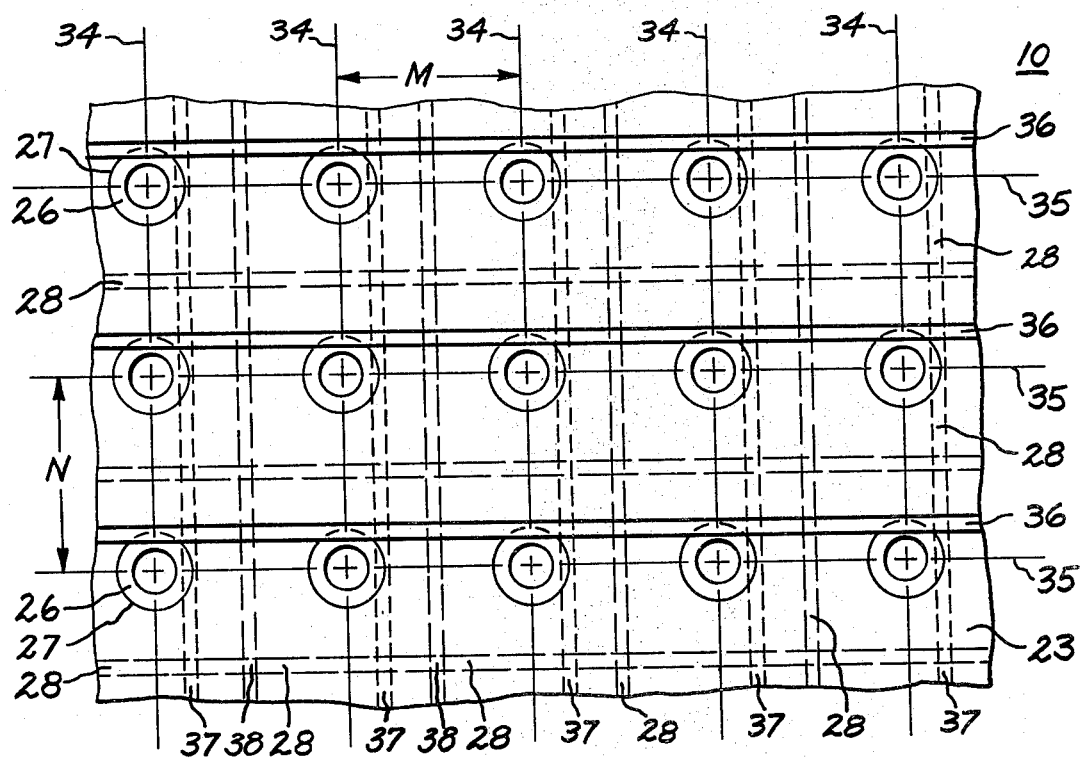
FIG. 4 is a bottom view, schematic in form, of a portion of the robotic pressure imager of FIG. 1 having sensing cells of the piezo-electric gate controlled diode type and means for addressing the diodes.

The robotic pressure imager 10 of FIG. 1 consists of a plurality of cells 20 arranged in an array. By the term array it is meant that cells 20 are arranged in a periodic repeating geometric pattern. An example of an array is shown in FIG. 4 which is imager 10 of FIG. 1 when viewed by looking at a portion of bottom surface 23. Illustratively, individual cells 20 are of the piezo-electric gate controlled diode type shown in FIGS. 2 and 2A. Cells 20 are bounded by the gridwork formed by intersecting isolation regions 28. When viewed from top surface 22, isolation regions 28 are continous between their points of intersection 38, but are shown as dotted lines in the bottom view of FIG. 4. The center lines of holes 21 are located at the orthogonal intersections of a first set of parallel lines 34 separated from each other by the distance M and a second set of parallel lines 35 separated from each other by the distance N which, in FIG. 4, is equal to M. Concentric with holes 21 are semiconducting regions 26 and interfaces 27.

The array of FIG. 4 is illustrative and is not intended to be limiting as other arrays compatible with the robotic functions to be performed are within the contemplation of the invention. For example, it may be advantageous for the array to consist of a grouping of a small number of cells in an array with the groupings themselves arranged in a larger array configuration, i.e., a hierarchy of arrays. Similarly, isolation regions 28 may be in a form other than the straight line segments of FIG. 4, e.g., a plurality of circles whose peripheries do or do not touch or intersect.

Further shown on FIG. 4 are means for obtaining the information from cells 20 of imager 10. A first series of parallel conductive strips 36 are placed in contact with or in the proximity of bottom surface 23, but in contact with semiconductor areas 26 using conventional semiconductor device manufacturing techniques. On upper surface 22, there is similarly provided in contact with the portions of semiconductor regions 26 accessible from top surface 22 a second series of parallel conductive strips 37 which are orthogonal to the first set. Microelectronic solid-state devices, for example, (not shown) may be provided to permit each cell 20 of imager 10 to be addressed individually.

The second set of semiconductor strips 37 may be provided on the same surface as first set 36 as is typical in the prior art. The uniqueness of through-thickness diodes 26, i.e., the combination of hole 21 plus semiconductor region 26, however, permits the conductive strips to be placed on opposite surfaces thus greatly reducing the potential for interference in the form of cross-talk which may arise in prior art devices. A protective covering layer (not shown) overlying bottom surface 23 may optionally be provided.

Use of the piezo-electric gate controlled diode (PZGCD) is generally preferred for cell 20 when imager 10 is used in the presence of floating potentials and in the presence of static electricity. In this type environment, it may be advantageous to place a grounded metal layer over piezo-electric layer 17 to shield imager 10 from stray charges. Such a grounded layer is shown schematically in FIG. 2 as layer 38. Layer 38 may be provided as a thin sheet applied over layer 17 or formed in place by such techniques as sputtering or evaporation of a metal such as aluminum. The thickness of layer 38 should be on the order of about 1 micron so as not to interfere with the ability of cells 20 to independently sense pressure changes. The piezoelectric field effect transistor (PZFET) is generally preferred for cell 20 when imager 10 is used in environments having alternating current (AC) type noise. Oxide layer 16 may also be considered optional with cells 20 and imager 10, however, use of layer 16 is preferable since it prevents the buildup of stray charges from impurity ions, for example, at top surface 22.

Those skilled in the art will readily recognize that other changes, omissions and additions from the form and detail of the preferred embodiments shown herein may be made without departing from the spirit and scope of the invention.

We claim:
1. A robotic pressure imager comprising:
   (a) a body of silicon, said body having spaced, generally parallel major top and bottom surfaces, a first preselected conductivity type, and a first preselected resistivity;

(b) a plurality of sensing cells in said body, each said sensing cell having one substantially cylindrical cavity extending between said top and bottom surfaces defined by a hollow generally cylindrical semiconductor region of substantially uniform cross-section substantially concentric with said cavity, said cylindrical semiconductor region extending between said top and bottom surfaces, having a conductivity type opposite to said first conductivity type;

(c) a gridwork of longitudinally-extending regions electronically isolating said sensing cells from each other, said isolating regions being embedded in said body from said top surface;

(d) a first set of longitudinally-extending substantially parallel electrically conductive members affixed to and electrically interconnecting said cylindrical semiconductor regions at the bottom ends thereof;

(e) a second set of longitudinally-extending substantially parallel electrically conductive members orthogonal to said first set affixed to and electrically interconnecting said cylindrical semiconductor regions at the top ends thereof;

(f) a layer of silicon oxide overlying substantially the balance of said top surface; and (g) a layer of piezo-electric thermoplastic fluorocarbon polymer material, said layer of piezo-electric polymer material overlying and adhering to said layer of oxide, said layer of piezo-electric polymer material being oriented so that stress applied thereto induces a change in the first conductivity type of the silicon of the sensing cell adjacent to the application of stress.

2. The robotic pressure imager of claim 1 wherein the diameter of each cylindrical cavity is about 1 mil, the distance between the center lines of cavities in adjacent sensing cells is about 2 mils and the isolating regions are situated about equidistant between said center lines of said cavities.

3. The robotic pressure imager of claim 1 wherein the fluorocarbon polymer is polyvinylidene fluoride.

4. The robotic pressure imager of claim 1 wherein each said isolation region is a semiconductor having said first preselected conductivity type and a second preselected resistivity, said second resistivity being different from said first resistivity.

5. A robotic pressure imager comprising:
(a) a body of silicon, said body having spaced, generally parallel major top and bottom surfaces, a first preselected conductivity type, and a first preselected resistivity;

(b) a plurality of sensing cells in said body, each said sensing cell having two substantially cylindrical cavities therein, said cavity extending from said bottom major surface close to, but not penetrating, said top major surface, each of said cavities being defined by a semiconductor regions consisting of a generally cylindrical first portion of substantially uniform cross-section concentric with said cavity and a second portion integral with said first portion defining the bottom of said cavity and extending to said top major surface, said semiconducting region having a conductivity type opposite to said first conductivity type;

(c) a gridwork of longitudinally-extending regions electronically isolating said sensing cells from each other, said isolating regions being embedded in said body from said top surface, (d) a first set of longitudinally-extending substantially parallel electrically conductive members affixed to and electrically interconnecting said semiconductor regions at the bottom ends thereof;

(e) a second set of longitudinally-extending substantially parallel electrically conductive members orthogonal to said first set affixed to and electrically interconnecting said semiconducting regions at the top ends thereof;

(f) a layer of silicon oxide overlying substantially the entirety of said top surface; and (g) a layer of piezo-electric thermoplastic fluorocarbon polymer material, said layer of piezo-electric polymer material overlying and adhering to said layer of oxide, said layer of piezo-electric polymer material being oriented so that stress applied thereto induces a change in the first conductivity type of the silicon of the sensing cell adjacent to the application of stress.

6. The robotic pressure imager of claim 5 wherein the diameter of each cylindrical cavity is about 1 mil, the distance between the center lines of cavities in adjacent sensing cells is about 2 mils and the isolating regions are situated about equidistant between said center lines of said cavities.

7. The robotic pressure imager of claim 5 wherein the fluorocarbon polymer is polyvinylidene fluoride.

8. The robotic pressure imager of claim 5 wherein each said isolation region is a semiconductor having said first preselected conductivity type and a second preselected resistivity, said second resistivity being different from said first resistivity.

* * * * *